(12) United States Patent
Choi et al.

(10) Patent No.: US 8,222,633 B2
(45) Date of Patent: Jul. 17, 2012

(54) ORGANIC TRANSISTOR USING THIAZOLOTHIAZOLE DERIVATIVES AND METHOD FOR FABRICATING THE SAME

(75) Inventors: Hyeon Choi, Daejeon (KR); Jae-Min Lee, Daejeon (KR); Roman Kiselev, Daejeon (KR)

(73) Assignee: LG Chem, Ltd., Seoul (KR)

( * ) Notice: Subject to any disclaimer, the term of this patent is extended or adjusted under 35 U.S.C. 154(b) by 342 days.

(21) Appl. No.: 12/449,519

(22) PCT Filed: Feb. 13, 2008

(86) PCT No.: PCT/KR2008/000857
§ 371 (c)(1),
(2), (4) Date: Aug. 12, 2009

(87) PCT Pub. No.: WO2008/100085
PCT Pub. Date: Aug. 21, 2008

(65) Prior Publication Data
US 2010/0012930 A1    Jan. 21, 2010

(30) Foreign Application Priority Data
Feb. 13, 2007 (KR) .................. 10-2007-0014879

(51) Int. Cl.
*H01L 29/08* (2006.01)
(52) U.S. Cl. ............ 257/40; 257/E51.005; 438/99
(58) Field of Classification Search ............ 257/40, 257/E51.005; 438/99
See application file for complete search history.

(56) References Cited

U.S. PATENT DOCUMENTS

| | | | |
|---|---|---|---|
| 6,372,154 B1 * | 4/2002 | Li | 252/301.16 |
| 6,875,996 B2 | 4/2005 | Nakamura | |
| 6,953,947 B2 | 10/2005 | Son et al. | |
| 7,002,176 B2 | 2/2006 | Iechi et al. | |
| 7,126,153 B2 | 10/2006 | Kondoh et al. | |
| 2002/0125819 A1 * | 9/2002 | Mishima | 313/504 |
| 2003/0213952 A1 * | 11/2003 | Iechi et al. | 257/40 |
| 2004/0164671 A1 * | 8/2004 | Noguchi | 313/504 |
| 2006/0113531 A1 * | 6/2006 | Halik et al. | 257/40 |
| 2006/0243965 A1 * | 11/2006 | De Leeuw et al. | 257/40 |
| 2007/0117963 A1 * | 5/2007 | Ong et al. | 528/377 |
| 2007/0128764 A1 * | 6/2007 | Tomino et al. | 438/99 |
| 2008/0142788 A1 * | 6/2008 | Li et al. | 257/40 |

FOREIGN PATENT DOCUMENTS
CN    1807428 A    7/2006
(Continued)

OTHER PUBLICATIONS

Ando, S., et al. "Characterization and Field-Effect Transistor Performance of Heterocyclic Oligomers Containing a Thiazolothiazole Unit." Chem. Lett., vol. 33 (2004): pp. 1170-1171.*

(Continued)

*Primary Examiner* — Kiesha Bryant
*Assistant Examiner* — Mark Tornow
(74) *Attorney, Agent, or Firm* — McKenna Long & Aldridge LLP

(57) ABSTRACT

The present invention relates to an organic transistor that includes an organic semiconductor layer containing a thiazolothiazole derivative and an insulating organic material having a band gap of 3 eV or more or no portion having four pairs or more of double bonds and single bonds continuously connected.

16 Claims, 1 Drawing Sheet

FOREIGN PATENT DOCUMENTS

| | | | |
|---|---|---|---|
| DE | 202005009955 U1 | * | 10/2005 |
| WO | WO 2007/145482 A1 | | 12/2007 |

OTHER PUBLICATIONS

Osaka, I., et al. "Novel Thiophene-Thiazolothiazole Copolymers for Organic Field-Effect Transistors." Adv. Mater., vol. 19 (2007): pp. 4160-4165.*

Ando, S., et al. "Synthesis, Physical Properties and Field-Effect Transistors of Novel Thiazolothiazole-Phenylene Co-polymers." J. Mater. Chem., vol. 17 (2007): pp. 553-558.*

Ando, S., et al. "Synthesis, Physical Properties, and Field-Effect Transistors of Novel Thiophene/Thiazolothiazole Co-oligomers." J. Mater. Chem., vol. 14 (2004): pp. 1787-1790.*

Lin, Y.-Y., et al "Stacked Pentacene Layer Organic Thin-Film Transistors with Improved Characteristics." IEEE Elect. Dev. Lett., vol. 18 (1997): pp. 606-608.*

Peng, Q., et al. "Synthesis and Electroluminescent Properties of Copolymers Based on Fluorene and 2,5-Di(2-hexyloxyphenyl)thiazolothiazole." Macromol., vol. 38 (2005): pp. 7292-7298.*

Andersson, L.M. & Inganas, O. "Non-Equilibrium Effects on Electronic Transport in Organic Field Effect Transistors." Org. Elect., vol. 8 (Feb. 13, 2007): pp. 423-430.*

Machine Translation of DE 202005009955 U1 (Publication Date 2005).*

Kumaki Daisuke et al., "Significant improvement of electron mobility in organic thin-film transistors based on thiazolothiazole derivative by employing self-assembled monolayer", Applied Physics Letters, AIP, American Institute of Physics, Melville, NY, US, vol. 90, No. 5, Feb. 1, 2007, pp. 53506-53506, XP012095870.

Ando Shinji et al., "high Performance n-Type Organic Field-Effect Transistors Based on π-Electronic Systems with Trifluoromethylphenyl Groups", Journal of the American Chemical Society, American Chemical Society, Washington, DC; US, vol. 127, No. 15, Jan. 1, 2005, pp. 5336-5337, XP002534244.

I. Osaka et al., "Novel Thiophene-Thiazolothiazole Copolymers for Organic Field-Effect Transistors", Advanced Materials, vol. 19, No. 23, Dec. 3, 2007, pp. 4160-4165, XP55003140.

* cited by examiner

[Fig. 1]
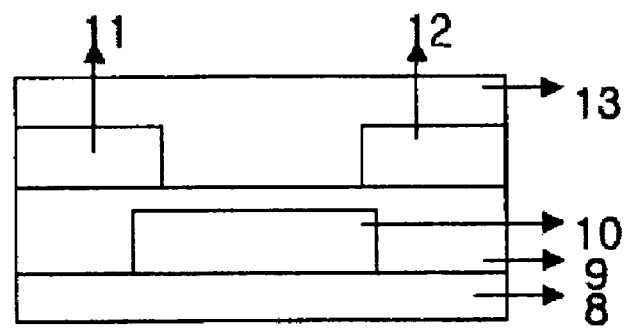
[Fig. 2]
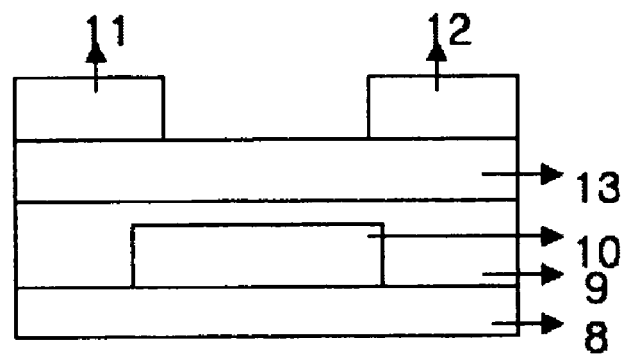

ORGANIC TRANSISTOR USING THIAZOLOTHIAZOLE DERIVATIVES AND METHOD FOR FABRICATING THE SAME

This application claims the benefit of PCT/KR2008/000857 filed on Feb. 13, 2008 and Korean Patent Application No. 10-2007-0014879 filed on Feb. 13, 2007, both of which are hereby incorporated herein by reference for all purposes in their entirety.

TECHNICAL FIELD

The present invention relates to a thiazolothiazole derivative, an organic transistor that includes an organic semiconductor layer containing an insulating organic material having a band gap of 3 eV or more or no portion having four pairs or more of double bonds and single bonds continuously connected, and a method of producing the same. This application claims priority from Korean Patent Application No. 10-2007-0014879 filed on Feb. 13, 2007 in the Korean Intellectual Property Office, the disclosure of which is incorporated herein by reference in its entirety.

BACKGROUND ART

A thin film type field-effect transistor (FET) is a basic structure in a microelectronic field. The FET includes three electrodes, that is, a source electrode, a drain electrode, and a gate electrode, an insulating layer, and a semiconductor layer. In the case of when the above semiconductor layer is a conductive channel between the two above electrodes, that is, the source electrode and the drain electrode, the FET acts as a capacitor. In the above channel, the concentration of the charge carrier is controlled by using voltage that is applied through the gate electrode. As a result, a flow of electric charges between the source electrode and the drain electrode may be controlled by voltage that is applied through the above gate electrode.

Recently, a concern has been grown rapidly about FETs using an organic semiconductor material. In the case of when the organic semiconductor material is used, electronic devices may be produced by using a printing process such as screen-printing, ink-jet printing, or micro-contact printing. In addition, in the case of when the above material is used, the process may be performed at a very low temperature of the substrate in a state where a vacuum is not required as compared to the case of when a known inorganic semiconductor material is used. Therefore, the electronic device using the organic semiconductor material including FETs may be produced under a very soft production condition at low cost as compared to the case of when the inorganic semiconductor material is used.

Studies have been conducted to use organic materials such as small molecules, polymers, and oligomers as an organic semiconductor material in FETs since the 1980s. With respect to results of studies in the above-mentioned field, in views of the charge carrier mobility in FETs, performance of the organic FET is increased from $10^{-5}$ cm$^2$/Vs to 1 cm$^2$/Vs (J. M. Shaw, P. F. Seidler, IBM J. Res. & Dev., Vol. 45, 3 (2001)). The performance of the organic transistor is as good as that of a current amorphous silicon transistor. Thus, the organic transistor may be applied to E-papers, smart cards, display devices or the like.

A structure of the organic transistor may be classified into a top gate structure or a bottom gate structure according to the position of the gate. As shown in FIGS. 1 and 2, the bottom gate structure may be classified into a top gate structure or a bottom gate structure according to the position of source/drain electrodes which are disposed on or under a semiconductor layer. In the organic transistor having the bottom gate structure, since the organic semiconductor layer is directly exposed to the outside, stability may be reduced. An organic semiconductor material sensitively reacts with moisture or oxygen. In particular, when oxygen and light are present simultaneously, the organic semiconductor material maybe damaged due to a photo oxidation reaction. This may cause a decrease in performance of the organic transistor. In order to avoid this, an encapsulation layer may be formed on the semiconductor layer. However, there is a problem in that in the course of forming the encapsulation layer, the organic semiconductor material may be dissolved or damaged. In addition, since the organic transistor is not used alone but used while being connected to a memory device or a display device, after the organic transistor is formed, there is a need to provide a function that is capable of protecting the organic semiconductor layer in order to perform the other processes.

[Disclosure]
[Technical Problem]

The present inventors have found that in the case of when an insulating organic material having a band gap of 3 eV or more or no portion having four pairs or more of double bonds and single bonds continuously connected is used in conjunction with a thiazolothiazole derivative in order to form an organic semiconductor layer, since the organic semiconductor layer is stable even though a separate encapsulation layer is not used, it is possible to increase resistance in respects to the outside environment while desirable performance of the organic transistor is maintained.

Therefore, it is an object of the present invention to provide a thiazolothiazole derivative, an organic transistor that includes an organic semiconductor layer containing an insulating organic material having a band gap of 3 eV or more or no portion having four pairs or more of double bonds and single bonds continuously connected, and a method of producing the same.

[Technical Solution]

The present invention provides an organic transistor that includes an organic semiconductor layer containing a thiazolothiazole derivative having a structural unit represented by the following Formula 1 and an insulating organic material having a band gap of 3 eV or more or no portion having four pairs or more of double bonds and single bonds continuously connected:

[Formula 1]

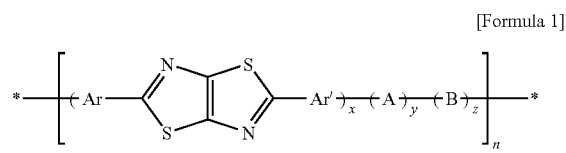

wherein x, y, and y are a ratio of structural units, x is a real number with 0<x≦1, y is a real number with 0≦y<1, z is a real number with 0≦z<1, and x+y+z=1, n is an integer in the range of 1 to 1,000, and more preferably 10 to 1,000, Ar and Ar' are the same as or different from each other, and are independently a bivalent cyclic or non-cyclic hydrocarbon group having a conjugated structure, or a bivalent heterocyclic group having a conjugated structure, A and B are the same as or different from each other, and are independently a bivalent cyclic or non-cyclic hydrocarbon group having a conjugated structure, a bivalent heterocyclic group having a conjugated structure, or an acyclic group as follows:

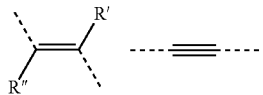

wherein R' and R" are the same as or different from each other, and may be independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group, or a substituted or unsubstituted heteroaryl group, and a dotted line is a portion linked to a main chain of Formula 1.

[Advantageous Effects]

According to the present invention, since a mixture of an insulating organic material having a band gap of 3 eV or more or no portion having four pairs or more of double bonds and single bonds continuously connected and a thiazolothiazole derivative is used in order to form an organic semiconductor layer of an organic transistor, it is possible to increase resistance in respects to the outside environment while desirable performance of the organic transistor is maintained even though a separate encapsulation layer is not used.

DESCRIPTION OF DRAWINGS

FIG. 1 illustrates a bottom contact type organic thin film transistor device that includes a substrate 8, an insulating layer 9, a gate electrode 10, a source electrode 11, a drain electrode 12, and an organic semiconductor layer 13; and FIG. 2 illustrates a top contact type organic thin film transistor device that includes a substrate 8, an insulating layer 9, a gate electrode 10, a source electrode 11, a drain electrode 12, and an organic semiconductor layer 13.

BEST MODE

In the above Formula 1, Ar or Ar' may be an arylene group or heteroarylene group having a conjugated structure.

In the above Formula 1, it is preferable that A or B be an aromatic group (Ar").

The aromatic group (Ar") which is an example of A or B is an arylene group or heteroarylene group, and preferably is a group that is represented by the following Formulae:

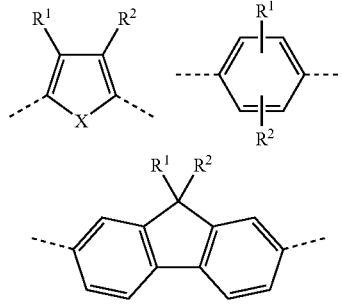

wherein X is an O, S, Se, $NR^3$, $SiR^3R^4$, or $CR^3R^4$ group, and $R^3$ and $R^4$ are the same as or different from each other, are independently a hydrogen atom; a linear, branched, or cyclic alkyl group; or an aryl group, and may be bonded to each other to form a ring, $R^1$ and $R^2$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^1$ and/or $R^2$ and are not adjacent to each other may be linked by O, S, NH, —$NR^O$—, $SiR^OR^{OO}$—, —CO—, —COO—, —OCO—, —OCOO—, —S—CO—, —CO—S—, —CH=CH—, a substituted or unsubstituted aryl group, or a substituted or unsubstituted heteroaryl group, $R^O$ and $R^{OO}$ are the same as or different from each other, and are independently hydrogen, an aryl group, or an alkyl group having 1 to 12 carbon atoms, and $R^1$ and $R^2$ may be bonded to each other to form a ring.

In the above Formula, in the case of when $R^1$ or $R^2$ is a substituted alkyl, alkoxy, or thioalkoxy group having 1 to 20 carbon atoms, the hydrogen atom bonded thereto may be substituted with at least one substituent group of fluorine, chlorine, bromine, iodine, and nitrile groups.

In the above Formula, in the case of when $R^1$ or $R^2$ is a substituted aryl or heteroaryl group, $R^1$ or $R^2$ may be substituted with at least one substituent group of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

Examples of Ar, Ar' and Ar" in the above Formulae will be listed as follows. However, these examples are for the illustrative purpose only, and the invention is not intended to be limited thereto.

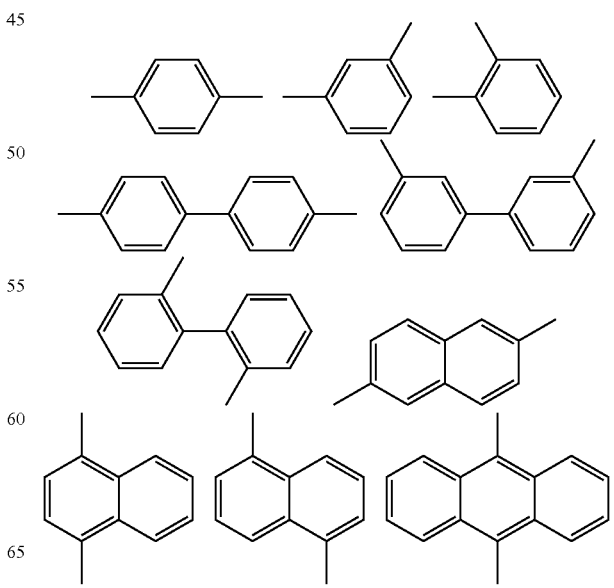

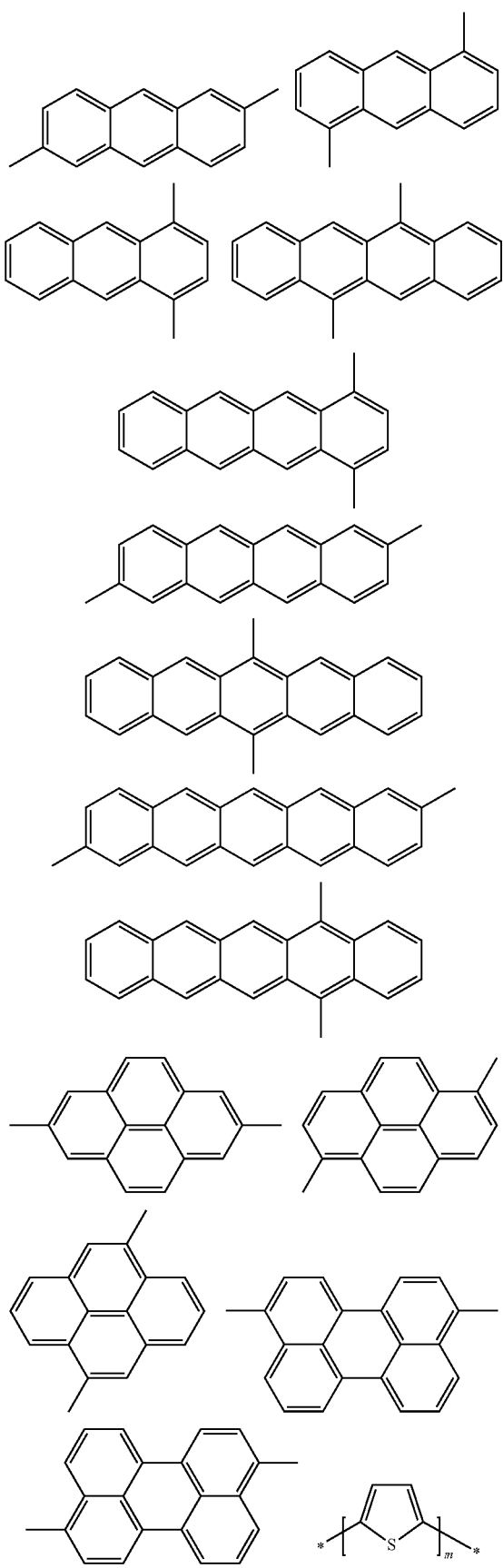
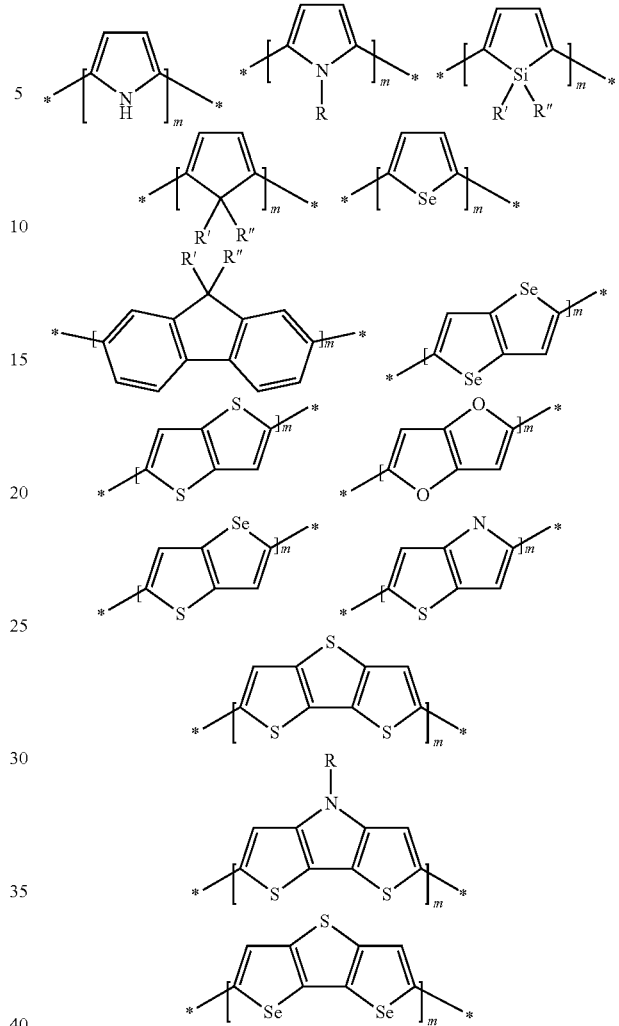

In the above Formulae, the position, at which no substituent is presented, may be a hydrogen atom, and may be substituted with at least one of a halogen group, an alkyl group, an alkoxy group, a thioalkoxy group, an aryl group, an amino group, a nitrile group, a nitro group, an ester group, an ether group, an amide group, an amide group, an imide group, a hetero group, a vinyl group, an acetylene group, a silane group, or the like, R, R' and R" are the same as or different from each other and are independently a hydrogen atom, an alkyl group, or an aryl group, and m is an integer in the range of 1 to 10 and more preferably an integer in the range of 1 to 6.

The compound that is represented by the above Formula 1 may include a structural unit that is represented by the following Formula 2:

[Formula 2]

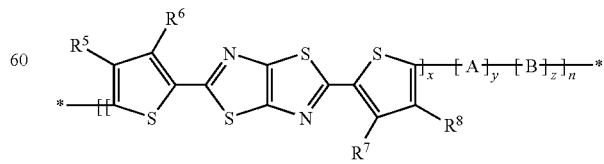

wherein $R^5$ to $R^8$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^5$ to $R^8$ and are not adjacent to each other may be linked by O, S, NH, —NR$^O$—, SiR$^O$R$^{OO}$—, —CO—, —COO—, —OCO—, —OCOO—, —S—CO—, —CO—S—, —CH=CH—, a substituted or unsubstituted aryl group, or a substituted or unsubstituted heteroaryl group, R$^O$ and R$^{OO}$ are the same as or different from each other, and are independently hydrogen, an aryl group, or an alkyl group having 1 to 12 carbon atoms, $R^5$ and $R^6$ or $R^7$ and $R^8$ may be bonded to each other to form a ring, and n, x, y, z, A, and B are as defined by Formula 1.

In the above Formula 2, in the case of when at least one of $R^5$ to $R^8$ is a substituted alkyl, alkoxy, or thioalkoxy group, the hydrogen atom substituted thereto may be substituted with at least one group of fluorine, chlorine, bromine, iodine, and nitrile.

In the above Formula 2, in the case of when at least one of $R^5$ to $R^8$ is a substituted aryl or heteroaryl group, $R^5$ to $R^8$ may be substituted with at least one of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

In the preferred embodiment of the present invention, specific examples of the above Formula 1 are represented by the following Formulae. However, these examples are for the illustrative purpose only, and the invention is not intended to be limited thereto.

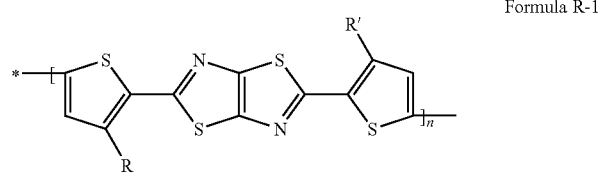

Formula R-1

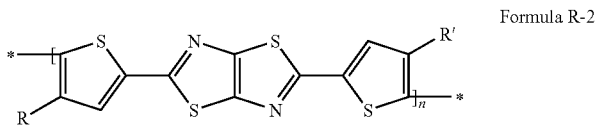

Formula R-2

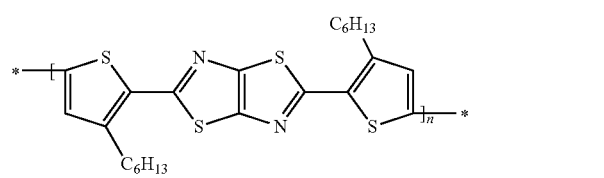

Formula S-1

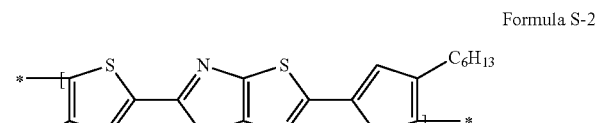

Formula S-2

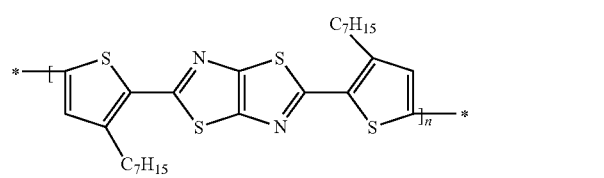

Formula S-3

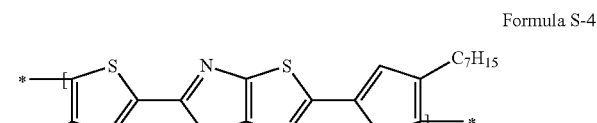

Formula S-4

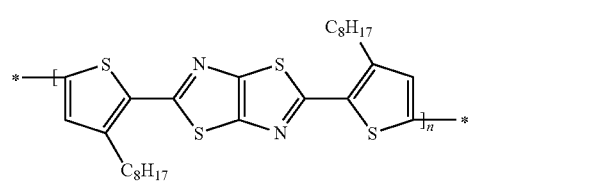

Formula S-5

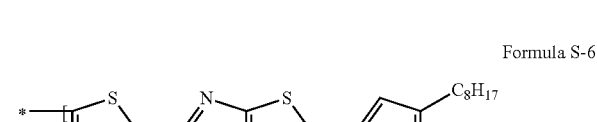

Formula S-6

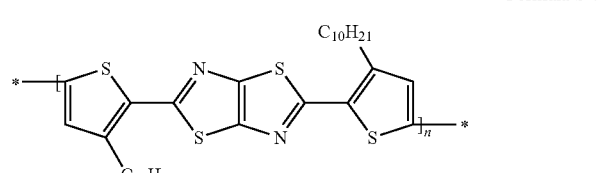

Formula S-7

Formula S-8

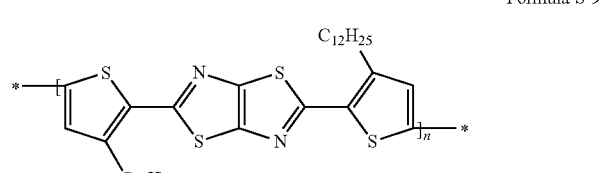

Formula S-9

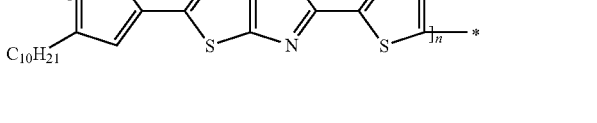

Formula S-10

-continued
Formula R-3
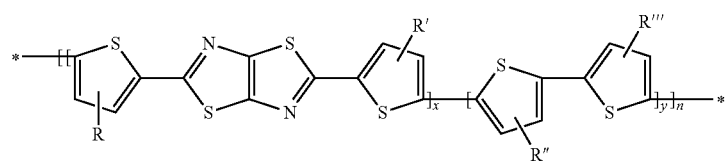
Formula S-11
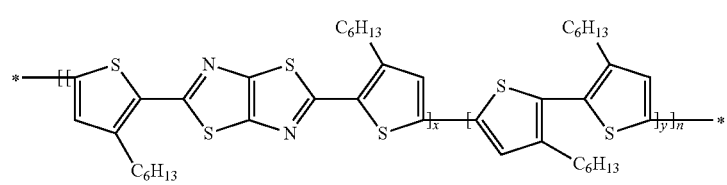
Formula S-12
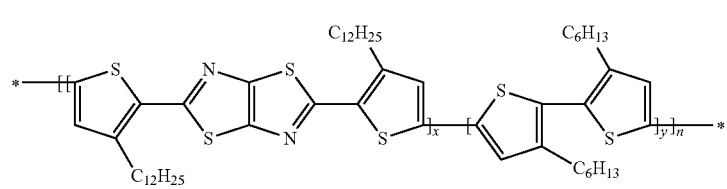
Formula S-13
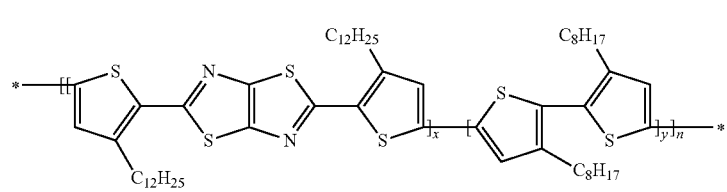
Formula S-14
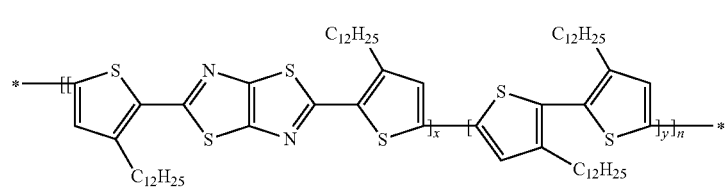
Formula R-4
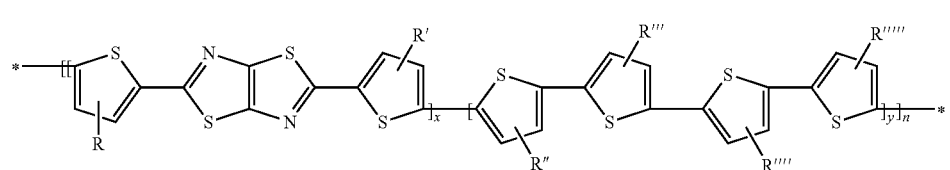
Formula S-15
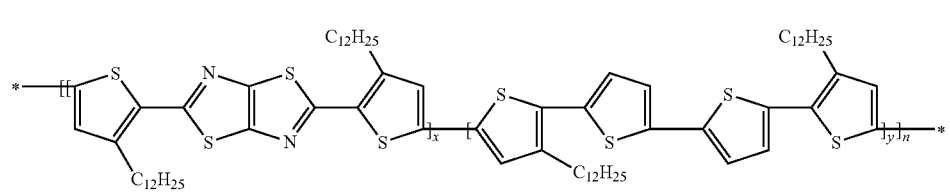
Formula S-16
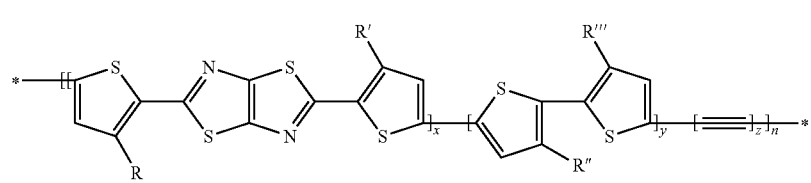
Formula S-17
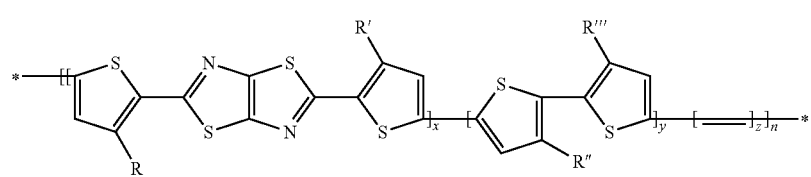

-continued
Formula S-18
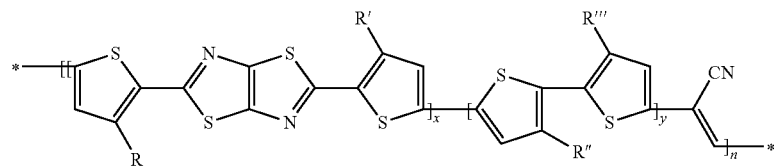
Formula S-19
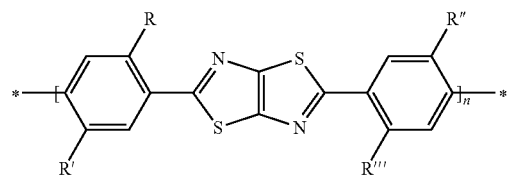
Formula S-20
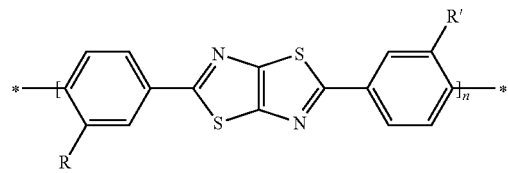
Formula S-21
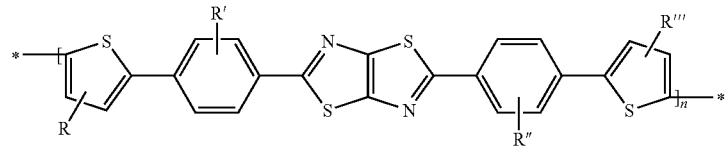
Formula S-22
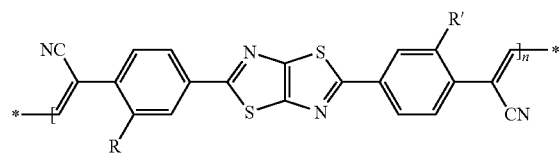
Formula S-23
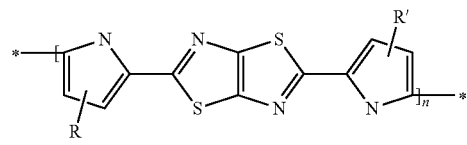
Formula S-24
Formula S-25
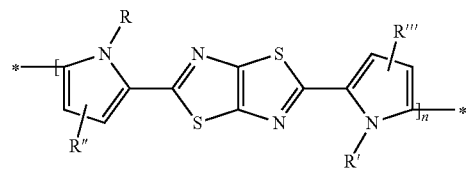
Formula S-26
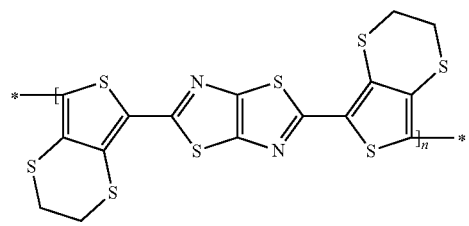
Formula S-27
Formula S-28
Formula S-29
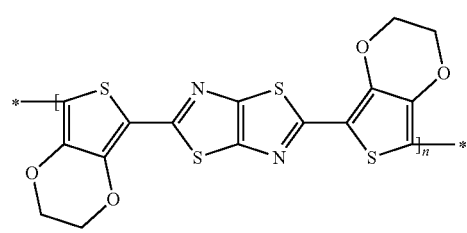

-continued
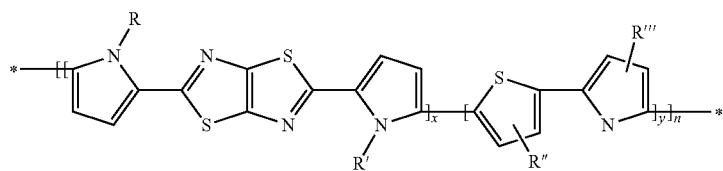
Formula S-30
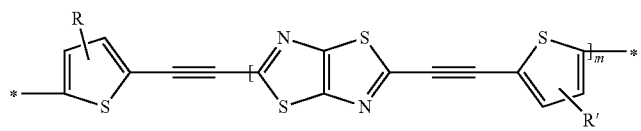
Formula S-31
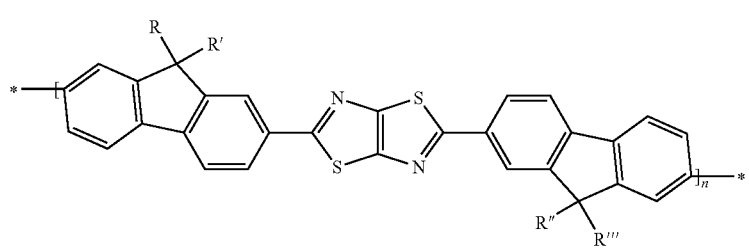
Formula R-5
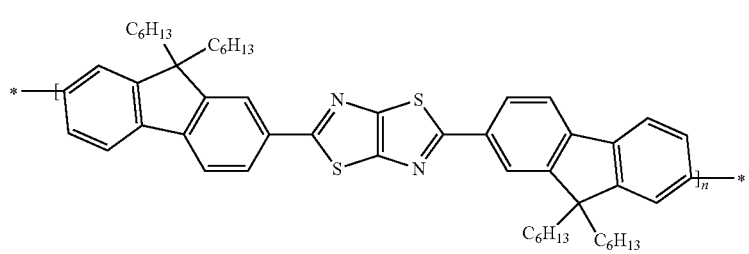
Formula S-32
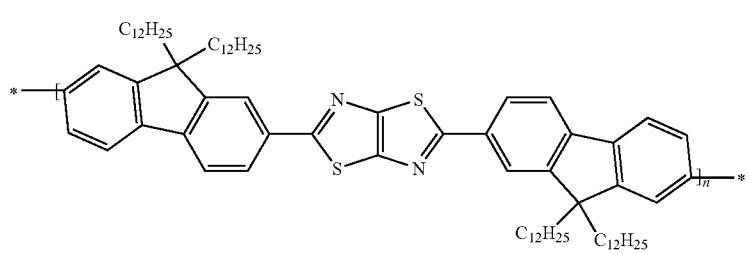
Formula S-33
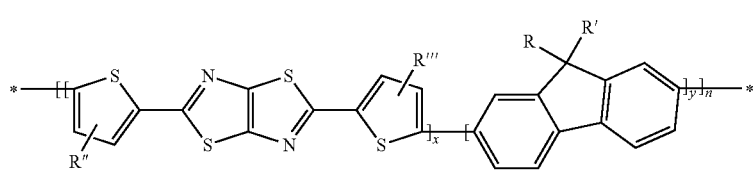
Formula S-34
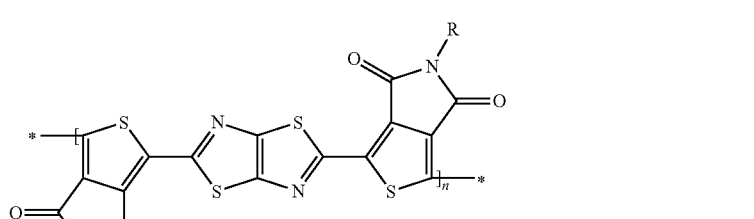
Formula S-35

-continued

Formula S-36

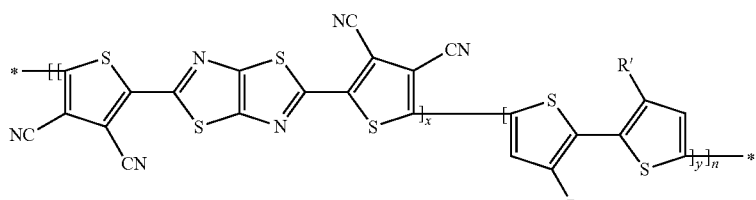

Formula S-37

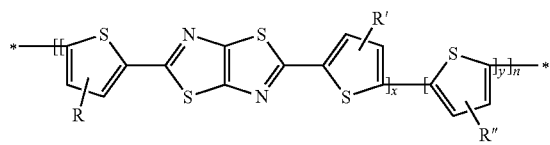

Formula S-38

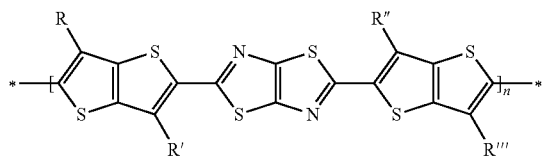

Formula S-39

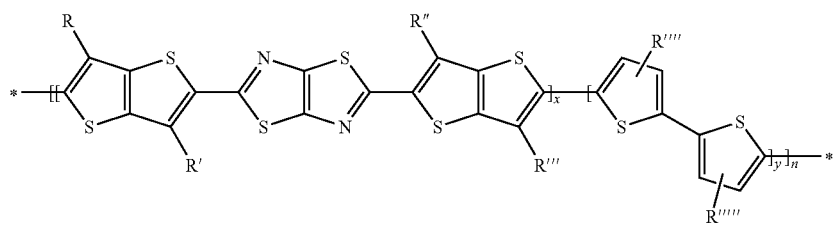

Formula S-40

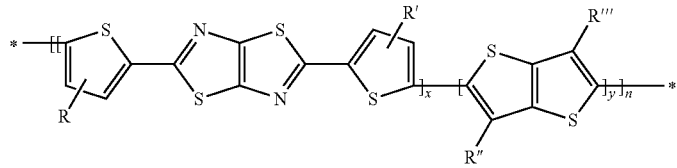

Formula S-41

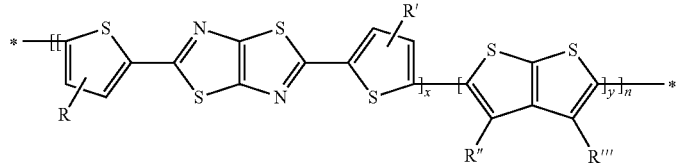

wherein R to R'''' contained in the above Formulae R-1 to R-5 and S-1 to S-41 are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group. They may be bonded to each other to form a ring, and n, x, and y are as defined by Formula 1.

An organic semiconductor layer of an organic transistor according to the present invention further includes an insulating organic material having a band gap of 3 eV or more or no portion having four pairs or more of double bonds and single bonds continuously connected in addition to a thiazolothiazole derivative.

In the case of when a material mixture that includes the thiazolothiazole derivative which is used in the present invention and the insulating organic material having the band gap of 3 eV or more or no portion having four pairs or more of double bonds and single bonds continuously connected is used to form the organic semiconductor layer, the thiazolothiazole derivative that is a semiconductor material starts to be crystallized at an interface of the organic semiconductor layer and the insulating layer, accordingly, the concentration of the organic semiconductor material is increased at the interface of the organic semiconductor layer and the insulating layer and the concentration of the insulating organic material having the band gap of 3 eV or more or no portion having four pairs or more of double bonds and single bonds continuously connected is increased as moving away from the interface of the organic semiconductor layer and the insulating layer.

In the case of the organic semiconductor material, when the portion having the double bonds and the single bonds alternately and continuously connected is maximized in the same plane, the charge conductivity is excellent and more improved when the planes are disposed close to each other between the organic semiconductor materials. That is, since the materials in which the conjugated structures including the portion having the double bonds and the single bonds alternately and continuously connected are maximized have the high interaction, the materials have the low interaction in respects to the material having the small conjugated structure.

The size of the conjugated structure may be expressed by the band gap. In the case of when the band gap has the value of 3 eV or more, the material may have the portion having three pairs or less of double bonds and single bonds continuously connected. Therefore, in the present invention, the insulating organic material having the band gap of 3 eV or more or no portion having four pairs or more of double bonds and single bonds continuously connected may be mixed with the thiazolothiazole derivative that is the above-mentioned organic semiconductor material to be used to form the organic semiconductor layer, thus contributing to stabilization of the organic semiconductor layer while performance of the organic transistor is not reduced according to the above-mentioned operation mechanism.

It is preferable that the insulating organic material having the band gap of 3 eV or more or no portion having four pairs or more of double bonds and single bonds continuously connected have poorer compatibility in respects to the organic semiconductor material in a solid phase than in a liquid phase.

In order to promote the above phenomenon, the interface of the insulating layer may be treated with a material having an affinity to a semiconductor material that is higher than an affinity to an insulating material. For example, the surface of the insulating layer may be treated with a SAM (self-assembled monolayer) material such as OTS (octadecyl-trichloro-silane) and HMDS (Hexamethyldisilazane). In the organic transistor, since an electric field that is generated from a gate electrode is concentrated at a distance in the range of 2 to 5 nm from the interface of the organic semiconductor layer and the insulating layer, the effect of the semiconductor layer that is far from the interface by 5 nm or more in respects to charge movement is insignificant. According to the present invention, the stability of the organic semiconductor layer may be improved while the performance of the organic transistor is not affected.

In the present invention, it is preferable that the band gap of the above insulating organic material be 7 eV or less.

Specific examples of the above insulating organic material include, but are not limited to polymethyl methacrylate (PMMA), polystyrene (PS), polycarbonate (PC), polyethylene terephthalate (PET), polybisphenol A, and a fluorine polymer compound.

According to the present invention, in the organic semiconductor layer, the weight ratio of the thiazolothiazole derivative and the insulating organic material is in the range of 1:1,000 to 1,000:1. If the weight ratio is less than 1:1,000, it is difficult to sufficiently fill the conductive layer that is within 5 nm from the surface of the insulating layer by using the semiconductor material. If the weight ratio is more than 1,000:1, it is impossible to apply the insulating organic material to a passivation layer. It is more preferable that the content ratio be in the range of 1:10 to 10:1.

In the present invention, the above thiazolothiazole derivative and the above insulating organic material having the band gap of 3 eV or more or no portion having four pairs or more of double bonds and single bonds continuously connected may be put into an organic solvent to prepare a solution mixture, and then subjected to a printing process such as screen printing, inkjet printing, or micro-contact printing, or a spin coating process to produce the above organic semiconductor layer.

The organic transistor according to the present invention may be produced by using a method and a material that are known in the art, except that the organic semiconductor layer is formed by using the above-mentioned material.

For example, the organic transistor according to the present invention may be produced by layering an insulating layer 9, a gate electrode 10, a source electrode 11, a drain electrode 12, and an organic semiconductor layer 13 on a substrate 8 according to a PVD (physical vapor deposition) process such as sputtering or e-beam evaporation or a solution coating process, but the scope of the present invention is not limited thereto. In connection with this, the above organic semiconductor layer may be formed to have a single layer structure or a multi layered structure.

Mode for Invention

Hereinafter, the present invention will be described in detail with reference to Examples. Examples are provided only for the purpose of illustrating the present invention, and accordingly it is not intended that the present invention is limited thereto.

EXAMPLE

Example 1

The n-doped silicon wafer was used as the substrate and the gate electrode, and silicon oxide (300 nm) that was grown and formed by using heat treatment was used as the gate insulating layer thereon. The source electrode and the drain electrode that were made of gold were formed on the gate insulating layer by using an e-beam. The substrate thus prepared was treated by using HMDS (hexamethyldisilazane). The solution in which the compound represented by Formula S-14 according to the present invention dissolved in chlorobenzene at a ratio of 0.2 w/v % and polymethyl methacrylate (PMMA) dissolved in chlorobenzene at a ratio of 0.2 w/v % were mixed with each other at a ratio of 50:50 was applied on the substrate on which the source electrode and the drain electrode were formed by using spin coating at a rate of 500 rpm for 30 sec, and subjected to a heat treatment process at 100° C. for 1 hour to form an organic semiconductor layer. In connection with this, the width and the length of the channel of the organic transistor were 300 μm and 10 μm, respectively.

The charge mobility of the produced organic transistor was 0.009 cm$^2$/V.s and the on/off ratio thereof was $10^4$ in a saturation region.

Comparative Example 1

The organic transistor was produced by using the same method as the production method of the above Example 1, except that polymethyl methacrylate (PMMA) was not used but the solution in which the compound represented by Formula S-14 according to the present invention was dissolved in chlorobenzene at a ratio of 0.4 w/v % was used.

The charge mobility of the produced organic transistor was 0.003 cm$^2$/V.s and the on/off ratio thereof was $10^3$ in a saturation region.

Example 2

The organic transistor was produced by using the same method as the production method of the above Example 1, except that polymethyl methacrylate (PMMA) was not used but polystyrene was used.

The charge mobility of the produced organic transistor was 0.006 cm$^2$/V.s and the on/off ratio thereof was $10^3$ in a saturation region.

Example 3

The organic transistor was produced by using the same method as the production method of the above Example 1, except that polymethyl methacrylate (PMMA) was not used but polybisphenol A was used.

The charge mobility of the produced organic transistor was 0.008 cm²/V.s and the on/off ratio thereof was 10³ in a saturation region.

Experimental Example

The positive photoresist (Positive PR) (AZ1512) was applied on the organic transistor which was produced in Example 1 and Comparative Example 1 by using a spin coating process at a rate of 3000 rpm for 32 sec and then subjected to a heat treatment process at 95° C. for 95 sec to form a PR (photoresist) layer. Next, the resulting organic transistor was dipped in the AZ340:deionized water (=1:3) solution for 60 sec to form the PR layer on the organic transistor.

After the PR layer was formed, the charge mobility of the organic transistor which was produced in Example 1 was 0.006 cm²/V.s in a saturation region. However, after the PR layer was formed, the performance of the organic transistor which was produced in Comparative Example 1 was not observed.

The invention claimed is:

1. An organic transistor comprising:
an organic semiconductor layer containing a thiazolothiazole derivative having a structural unit represented by the following Formula 1 and an insulating organic material having a band gap of 3 eV or more or no portion having four pairs or more of double bonds and single bonds continuously connected:

[Formula 1]

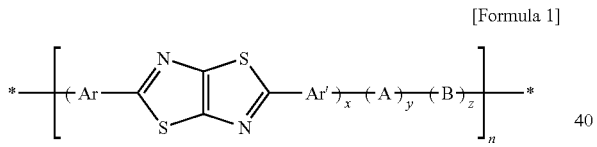

wherein x, y, and y are a ratio of structural units, x is a real number with $0<x\leq 1$, y is a real number with $0\leq y<1$, z is a real number with $0\leq z<1$, and $x+y+z=1$, n is an integer in the range of 10 to 1,000, Ar and Ar' are the same as or different from each other, and are independently a bivalent cyclic or non-cyclic hydrocarbon group having a conjugated structure, or a bivalent heterocyclic group having a conjugated structure, A and B are the same as or different from each other, and are independently an aromatic group (Ar"), a bivalent heterocyclic group having a conjugated structure, or an acyclic group as follows:

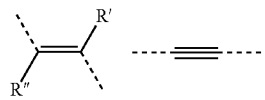

wherein R' and R" are the same as or different from each other, and may be independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group; or a substituted or unsubstituted heteroaryl group, and a dotted line is a portion linked to a main chain of Formula 1, the aromatic group (Ar") is selected from groups that are represented by the following Formulae:

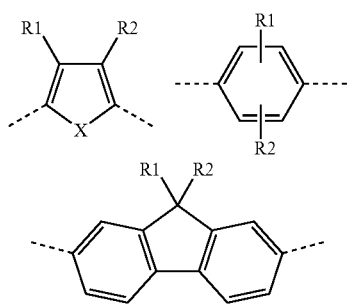

wherein X is an O, S, Se, NR³, SiR³R⁴, or CR³R⁴ group, and R³ and R⁴ are the same as or different from each other, are independently a hydrogen atom; a linear, branched, or cyclic alkyl group; or an aryl group, and may be bonded to each other to form a ring, R¹ and R² are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in R¹ and/or R² and are not adjacent to each other may be linked by O, S, NH, —NRO—, SiR⁰R⁰⁰—, —CO—, —COO—, —OCO—, —OCOO—, —S—CO—, —CO—S—, —CH=CH—, a substituted or unsubstituted aryl group, or a substituted or unsubstituted heteroaryl group, R⁰ and R⁰⁰ are the same as or different from each other, and are independently hydrogen, an aryl group, or an alkyl group having 1 to 12 carbon atoms, and R¹ and R² may be bonded to each other to form a ring.

2. The organic transistor as set forth in claim 1, wherein Ar or Ar' is an arylene group or heteroarylene group having a conjugated structure.

3. The organic transistor as set forth in claim 1, wherein when R¹ or R² is a substituted alkyl, alkoxy, or thioalkoxy group having 1 to 20 carbon atoms, R¹ or R² is substituted with at least one substituent group selected from the group consisting of fluorine, chlorine, bromine, iodine, and nitrile groups.

4. The organic transistor as set forth in claim 1, wherein when R¹ or R² is a substituted aryl or heteroaryl group, R¹ or R² is substituted with at least one substituent group selected from the group consisting of a halogen group, a nitrile group, a hydroxyl group, an alkyl group, an alkoxy group, a vinyl group, an acetylene group, a thioalkoxy group, a nitro group, an amide group, an ester group, an ether group, an amino group, and a silane group.

5. The organic transistor as set forth in claim 1, wherein Ar and Ar' are each independently selected from the following Formulae:
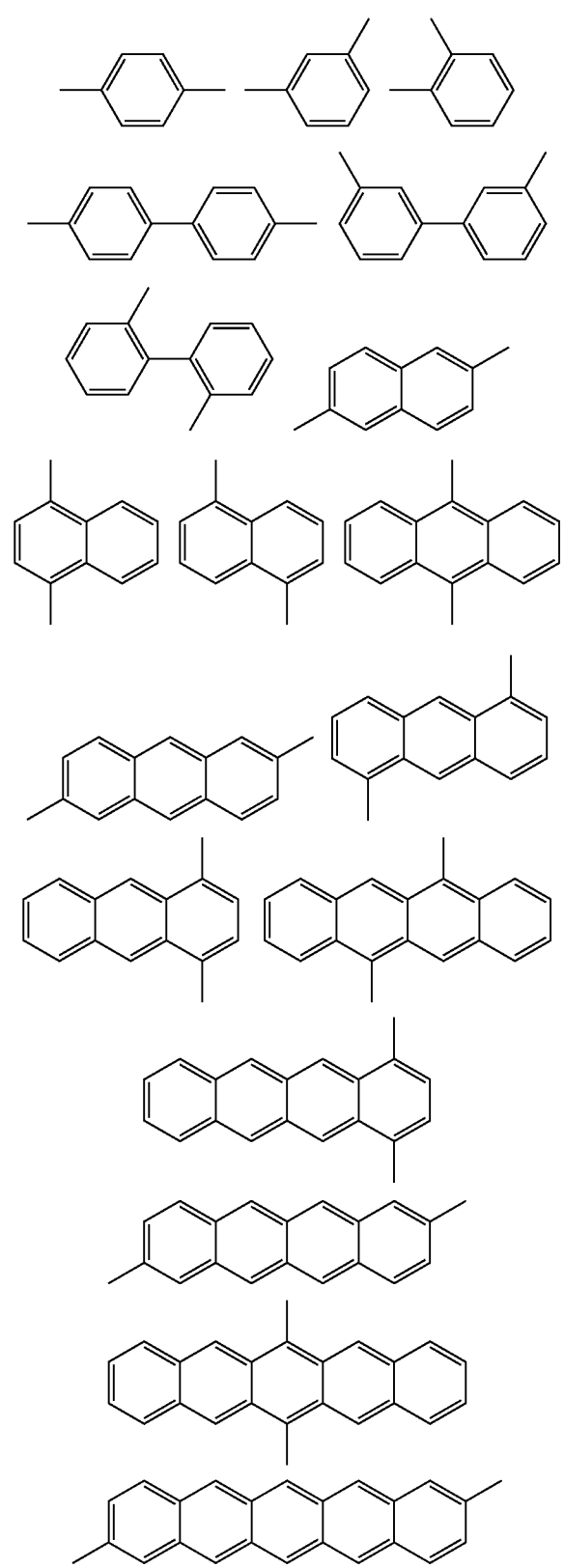
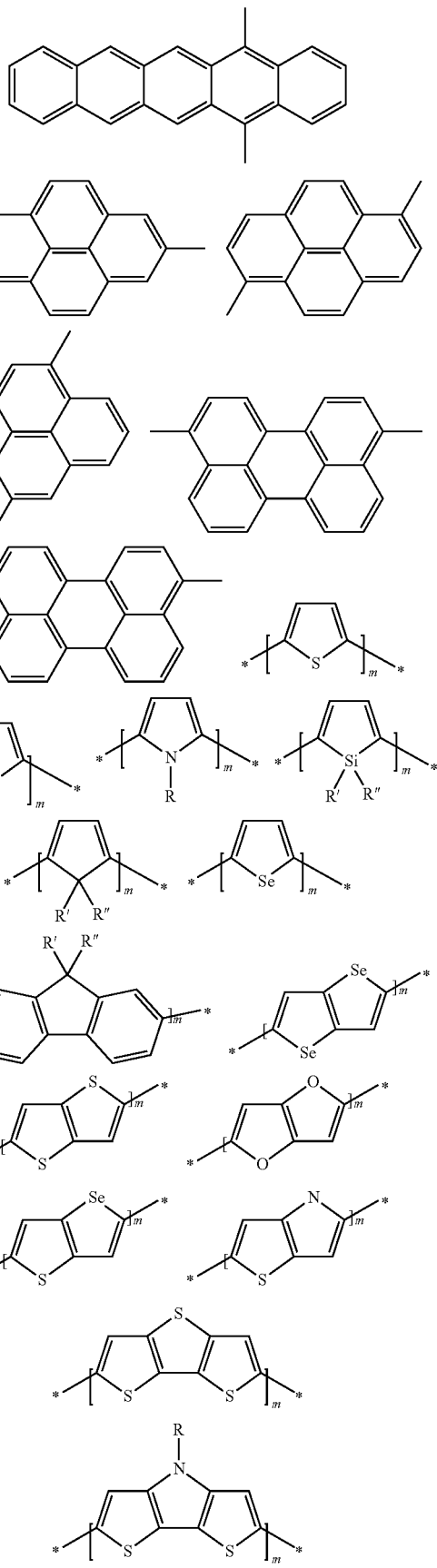

23
-continued

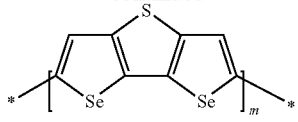

and Ar" is selected from the following Formulae:

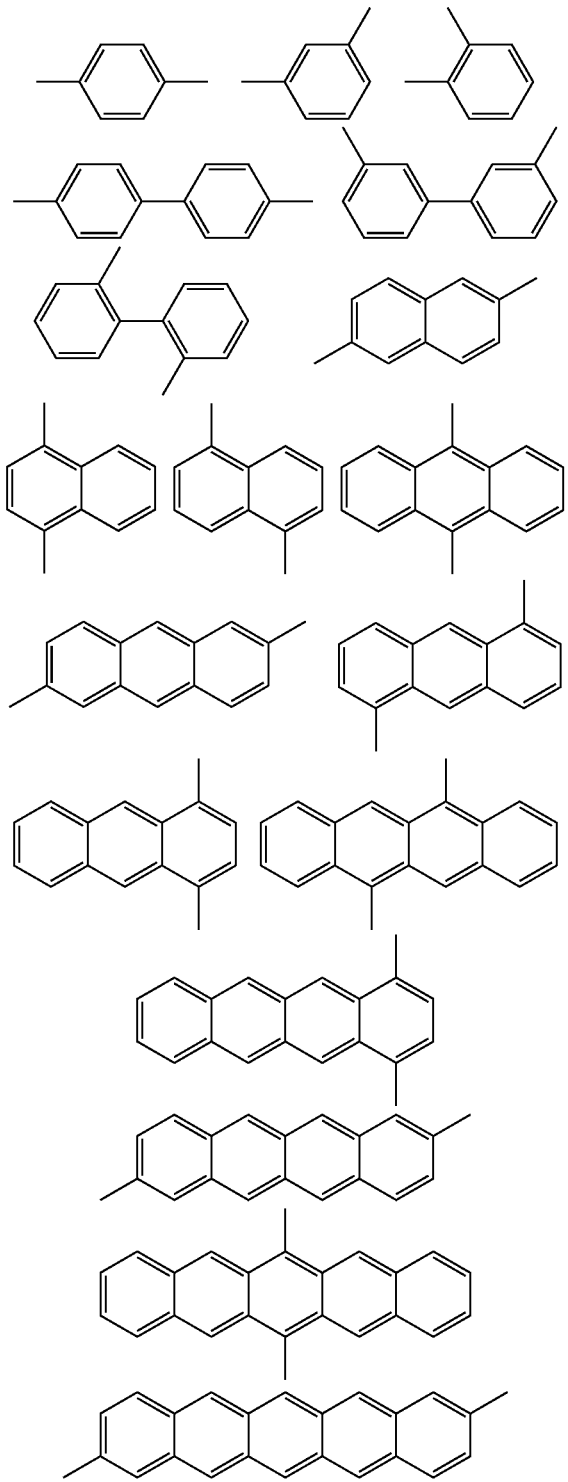

24
-continued

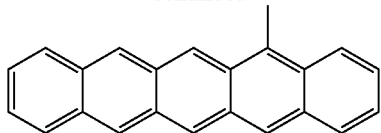

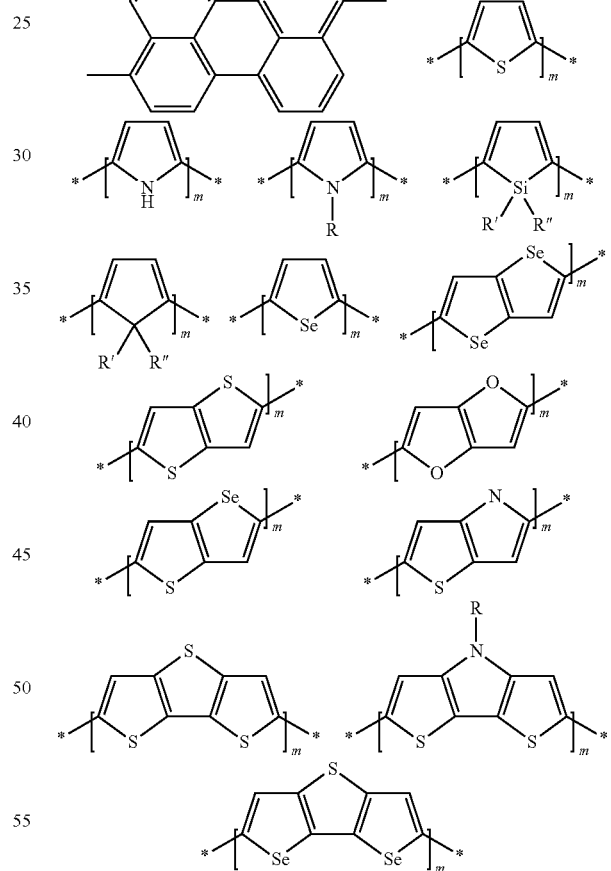

wherein the position, at which no substituent is presented, is a hydrogen atom, or has a substituent group selected from a halogen group, an alkyl group, an alkoxy group, a thioalkoxy group, an aryl group, an amino group, a hetero group, a vinyl group, an acetylene group, and a silane group, R, R', and R" are the same as or different from each other and are independently a hydrogen atom, an alkyl group, or an aryl group, and m is an integer in the range of 1 to 10.

6. The organic transistor as set forth in claim 1, wherein the thiazolothiazole derivative includes a structural unit that is represented by the following Formula 2:

[Formula 2]

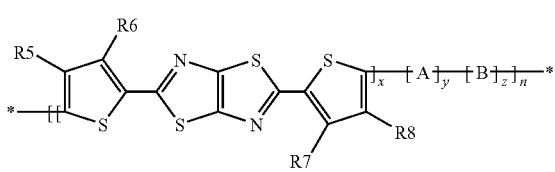

wherein $R^5$ to $R^8$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^5$ to $R^8$ and are not adjacent to each other may be linked by O, S, NH, —NRO—, SiR$^O$R$^{OO}$—, —CO—, —COO—, —OCO—, —OCOO—, —S—CO—, —CO—S—, —CH=CH—, a substituted or unsubstituted aryl group, or a substituted or unsubstituted heteroaryl group, $R^O$ and $R^{OO}$ are the same as or different from each other, and are independently hydrogen, an aryl group, or an alkyl group having 1 to 12 carbon atoms, $R^5$ and $R^6$ or $R^7$ and $R^8$ may be bonded to each other to form a ring, and n, x, y, z, A, and B are as defined by Formula 1.

7. The organic transistor as set forth in claim 6, wherein when at least one of $R^5$ to $R^8$ is a substituted alkyl, alkoxy, or thioalkoxy group having 1 to 20 carbon atoms, the hydrogen atom substituted thereto is substituted with at least one substituent group selected from the group consisting of fluorine, chlorine, bromine, iodine, and nitrile groups.

8. The organic transistor as set forth in claim 6, wherein when at least one of $R^5$ to $R^8$ is a substituted aryl or heteroaryl group, at least one of $R^5$ to $R^8$ is substituted with at least one substituent group selected from the group consisting of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

9. The organic transistor as set forth in claim 1, wherein a compound that is represented by the above Formula 1 includes a structural unit that is selected from the following Formulae R-1 to R-5, S-16 to S-31, and S-35 to S-41:

Formula R-1

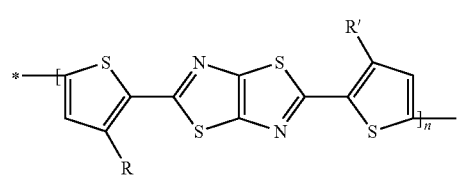

Formula R-2

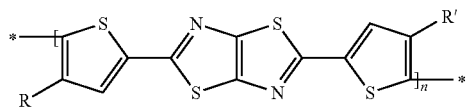

Formula R-3

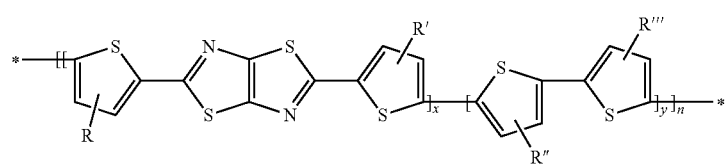

Formula R-4

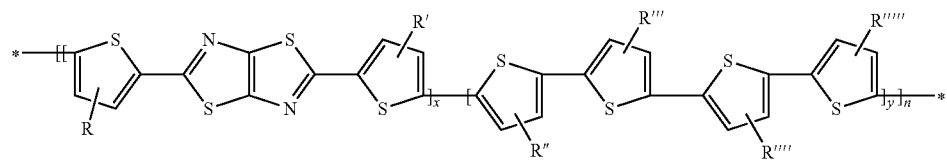

Formula R-5

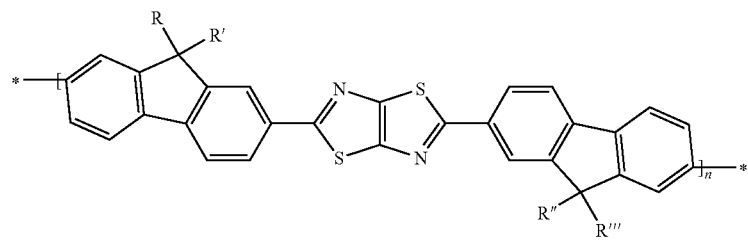

Formula S-16

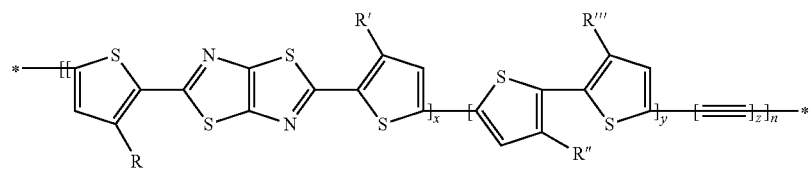

Formula S-17
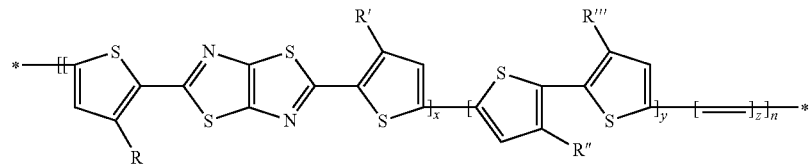
Formula S-18
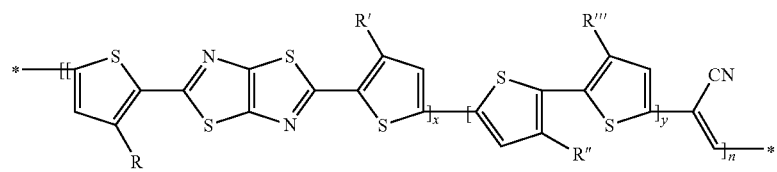
Formula S-19
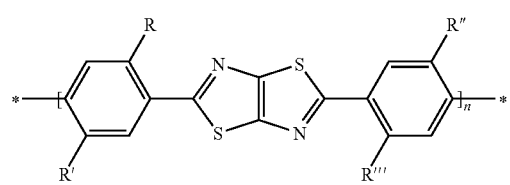
Formula S-20
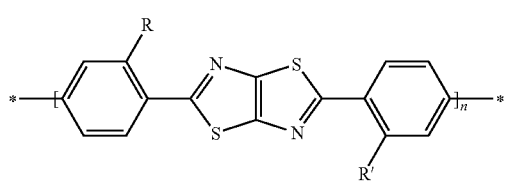
Formula S-21
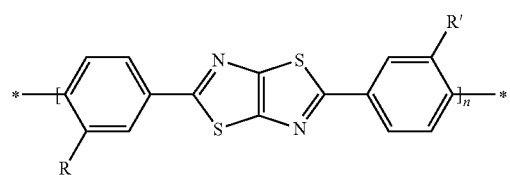
Formula S-22
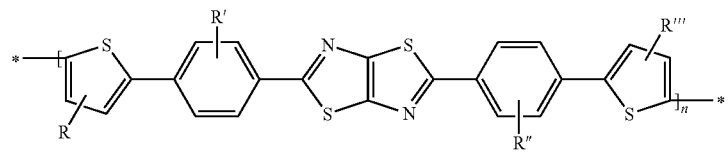
Formula S-23
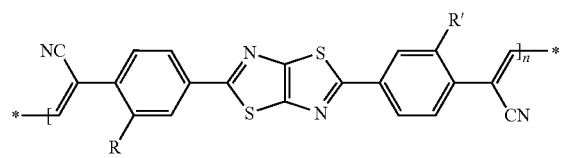
Formula S-24
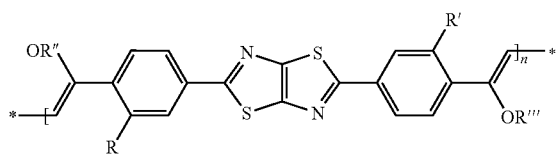
Formula S-25
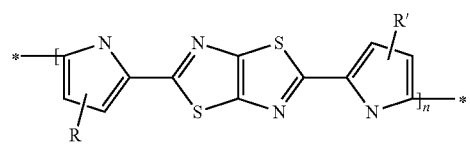
Formula S-26
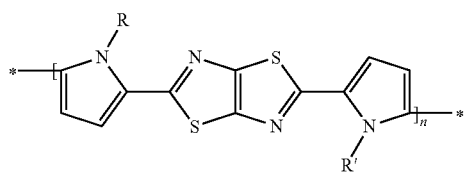
Formula S-27
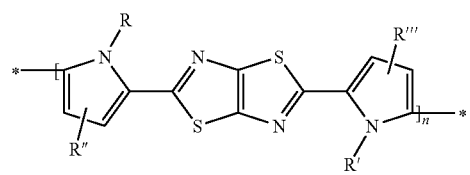
Formula S-28
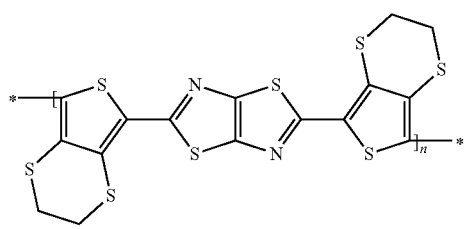

-continued
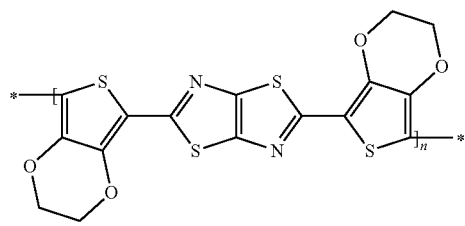
Formula S-29
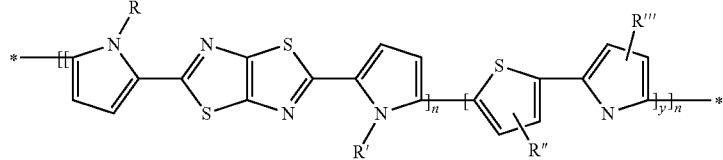
Formula S-30
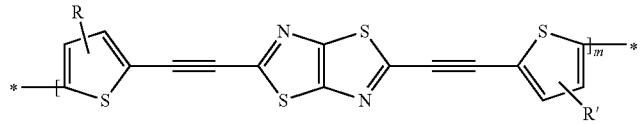
Formula S-31
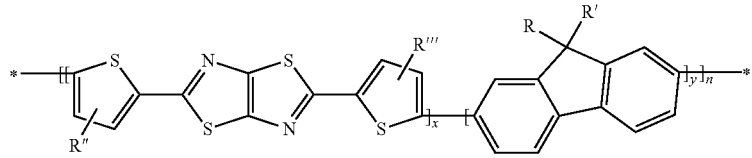
Formula S-34
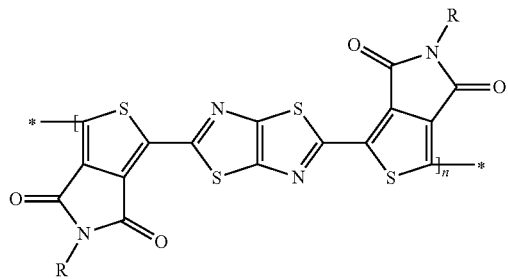
Formula S-35
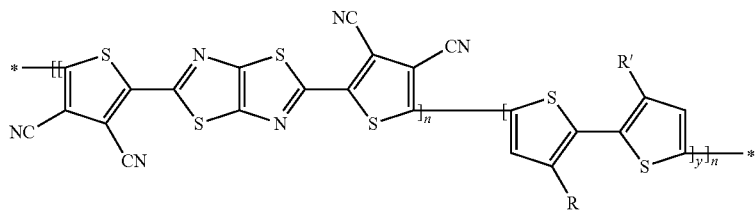
Formula S-36
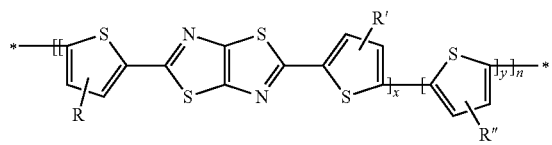
Formula S-37
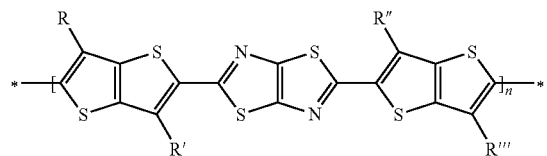
Formula S-38
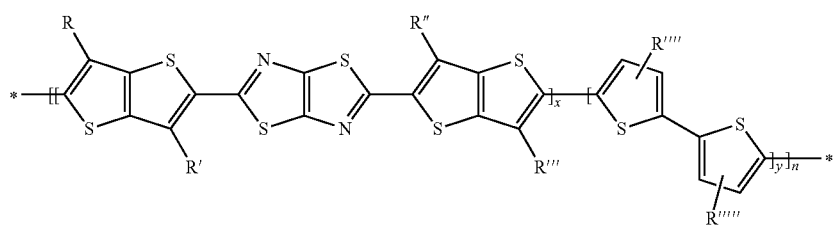
Formula S-39

-continued

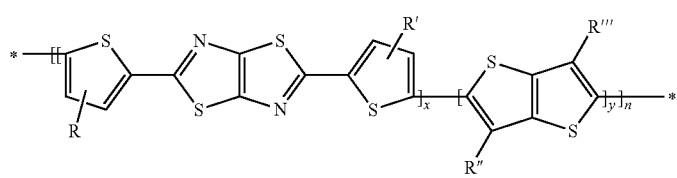

Formula S-40

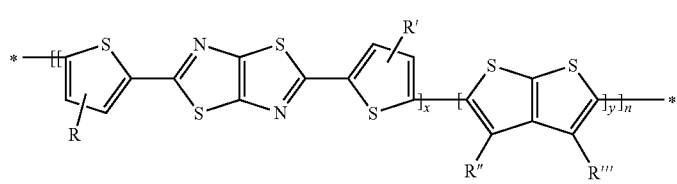

Formula S-41 wherein R to R'''' of the above Formulae are the same as or different from each other, and are independently a hydrogen atom, an oxygen atom, a halogen atom, a nitrile group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group.

10. The organic transistor as set forth in claim 1 further comprising a insulating layer, wherein an interface of the organic semiconductor layer and the insulating layer is treated with a material having an affinity to a semiconductor material that is higher than an affinity to an insulating material.

11. The organic transistor as set forth in claim 10, wherein the material having the affinity to the semiconductor material that is higher than the affinity to the insulating material is OTS (octadecyl-trichloro-silane) or HMDS (Hexamethyldisilazane).

12. The organic transistor as set forth in claim 1, wherein the insulating organic material having a band gap of 3 eV or more or no portion having four pairs or more of double bonds and single bonds continuously connected includes one or more selected from the group consisting of polymethyl methacrylate (PMMA), polystyrene (PS), polycarbonate (PC), polyethylene terephthalate (PET), polybisphenol A, and a fluorine polymer compound.

13. The organic transistor as set forth in claim 1, wherein the organic semiconductor layer includes the thiazolothiazole derivative and the insulating organic material having a band gap of 3 eV or more or no portion having four pairs or more of double bonds and single bonds continuously connected at a weight ratio of 1:1,000 to 1,000:1.

14. A method of producing an organic transistor, which includes layering an insulating layer, a gate electrode, a source electrode, a drain electrode, and an organic semiconductor layer on a substrate, the organic semiconductor layer being formed by using a solution mixture that includes a thiazolothiazole derivative containing a structural unit represented by the following Formula 1 and an insulating organic material having a band gap of 3 eV or more or no portion having four pairs or more of double bonds and single bonds continuously connected:

[Formula 1]

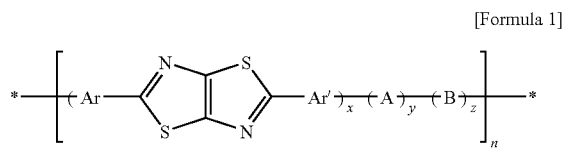

wherein x, y, and y are a ratio of structural units, x is a real number with 0<x≦1, y is a real number with 0≦y<1, z is a real number with 0≦z<1, and x+y+z=1, n is an integer in the range of 10 to 1,000, Ar and Ar' are the same as or different from each other, and are independently a bivalent cyclic or non-cyclic hydrocarbon group having a conjugated structure, or a bivalent heterocyclic group having a conjugated structure, A and B are the same as or different from each other, and are independently an aromatic group (Ar''), a bivalent heterocyclic group having a conjugated structure, or an acyclic group as follows:

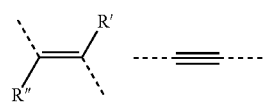

wherein R' and R'' are the same as or different from each other, and may be independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group; or a substituted or unsubstituted heteroaryl group, and a dotted line is a portion linked to a main chain of Formula 1, the aromatic group (Ar'') is selected from groups that are represented by the following Formulae:

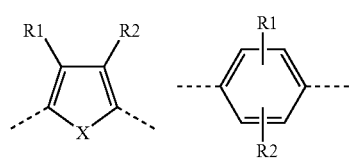

-continued

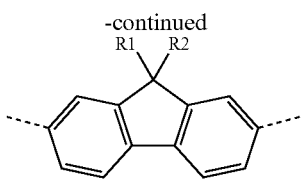

wherein X is an O, S, Se, $NR^3$, $SiR^3R^4$, or $CR^3R^4$ group, and $R^3$ and $R^4$ are the same as or different from each other, are independently a hydrogen atom; a linear, branched, or cyclic alkyl group; or an aryl group, and may be bonded to each other to form a ring, $R^1$ and $R^2$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^1$ and/or $R^2$ and are not adjacent to each other may be linked by O, S, NH, —NRO—, $SiR^oR^{oo}$—, —CO—, —COO—, —OCO—, —OCOO—, —S—CO—, —CO—S—, —CH=CH—, a substituted or unsubstituted aryl group, or a substituted or unsubstituted heteroaryl group, $R^o$ and $R^{oo}$ are the same as or different from each other, and are independently hydrogen, an aryl group, or an alkyl group having 1 to 12 carbon atoms, and $R^1$ and $R^2$ may be bonded to each other to form a ring.

15. The method of producing an organic transistor as set forth in claim 14, wherein the organic semiconductor layer is formed by using screen printing, inkjet printing, micro-contact printing, or spin coating.

16. The method of producing an organic transistor as set forth in claim 14, further comprising:

treating an interface of the organic semiconductor layer and the insulating layer by using a material having an affinity to a semiconductor material that is higher than an affinity to an insulating material.

* * * * *